United States Patent
Chen

(10) Patent No.: US 6,380,012 B1
(45) Date of Patent: Apr. 30, 2002

(54) BORON DIFLUORIDE PLASMA DOPING METHOD FOR FORMING ULTRA-SHALLOW JUNCTION

(75) Inventor: Wei Wen Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/777,249

(22) Filed: Feb. 5, 2001

(30) Foreign Application Priority Data

Dec. 8, 2000 (TW) .......................................... 89126180

(51) Int. Cl.⁷ ............................................. H01L 21/338
(52) U.S. Cl. ........................ 438/174; 438/194; 438/230
(58) Field of Search ................................. 438/163, 174, 438/194, 230, 238

(56) References Cited

U.S. PATENT DOCUMENTS 6,107,129 A  * 8/2000 Gardner et al. ............. 438/230
6,127,216 A  * 10/2000 Yu ............................. 438/238
6,225,176 B1 * 5/2001 Yu ............................. 438/305

* cited by examiner

Primary Examiner—David Nelms
Assistant Examiner—Thao P Le
(74) Attorney, Agent, or Firm—J.C. Patents

(57) ABSTRACT

A boron difluoride plasma doping method to form an ultra-shallow junction. A semiconductor substrate is put inside a reaction chamber and then a boron difluoride ions ($BF_2^+$) containing plasma is generated inside the chamber. A negative voltage is applied to the semiconductor substrate so that the boron difloride ions ($BF_2^+$) accelerate and bombard against the semiconductor substrate to form an ultra-shallow junction on a superficial layer of the substrate. A rapid annealing operation is conducted to repair any defects in the crystal lattice that results from the formation of the ultra-shallow junction.

15 Claims, 1 Drawing Sheet

Negative Voltage Pulse

Negative Voltage Pulse

BORON DIFLUORIDE PLASMA DOPING METHOD FOR FORMING ULTRA-SHALLOW JUNCTION

CROSS-REFERENCE TO RELATED APPLICATION

This application claims the priority benefit of Taiwan application serial no. 89126180, filed Dec. 8, 2000.

BACKGROUND OF THE INVENTION

1. Field of Invention

The present invention relates to a method of manufacturing a semiconductor device. More particularly, the present invention relates to a boron difluoride plasma doping method for forming an ultra-shallow junction.

2. Description of Related Art

As gate width of a metal-oxide-semiconductor (MOS) device drops to 0.18 $\mu$m or smaller, the channel length of the MOS device also reduces correspondingly. Hence, junction depth of the source/drain terminal must be controlled precisely in order to reduce punchthrough current and short channel effect. Ultimately, the fabrication of an ultra-shallow junction in the substrate is essential. To produce a small dimensional semiconductor device, a lower energy implantation has to be conducted to reduce implant depth. Moreover, a faster thermal annealing operation is required to prevent the diffusion of the implanted dopants.

At present, methods for forming an ultra-shallow junction include ultra-low energy ion implantation, wafer tilt implantation and pre-amorphized implantation. In general, the ultra-low energy ion implantation is unsuitable for fabricating semiconductor devices having a line width smaller than 0.1 $\mu$m. This is because the ions produced in an ultra-low ion implantation have very low speed. With an ion flow rate of only about one-tenth of the previous generation, a long implantation period is required. Hence, production rate is too low for mass production. On the other hand, as channel length of a semiconductor device continues to reduce, wafer tilt implantation will produce source/drain terminals that extend deep into the region underneath the gate. Consequently, punch-through and short channel effect will be intensified. Furthermore, since low energy is already used in the implantation of most small dimensional devices, ultra shallower junction can no longer be obtained from pre-amorphized implantation.

In addition, the cross-section of the ion beam used in a conventional ion implantation method is generally very narrow. A two-dimension scanning of the ion beam across the surface of a wafer is often required to implant ions into every region of a wafer. Therefore, a lot of time is required to produce each wafer.

SUMMARY OF THE INVENTION

Accordingly, one object of the present invention is to provide a boron difluoride plasma doping method to form an ultra-shallow junction such as a PMOS ultra-shallow junction. First, a semiconductor substrate is put inside a reaction chamber and then a boron difluoride ions ($BF_2^+$) containing plasma is generated inside the chamber. A negative voltage is applied to the semiconductor substrate so that the boron difluoride ions ($BF_2^+$) accelerate and bombard against the semiconductor substrate to form an ultra-shallow junction on a superficial layer of the substrate. Finally, a rapid annealing operation is conducted to repair any defects in the crystal lattice that results from the formation of the ultra-shallow junction.

According to the method of this invention, a wafer is placed inside a reaction chamber and then boron difluoride plasma is generated inside the reaction chamber so that the entire wafer is surrounded by boron difluoride ions ($BF_2^+$). With the application of a suitable size negative voltage to the semiconductor substrate, boron difluoride ions ($BF_2^+$) are implanted into the substrate to form an ultra-shallow junction. Thus, this invention can be regarded as a high ion flow rate global ion implantation. Unlike a conventional low-ion-flow-rate low-energy-level ion beam implantation, less time is required to produce each wafer and productivity can be increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
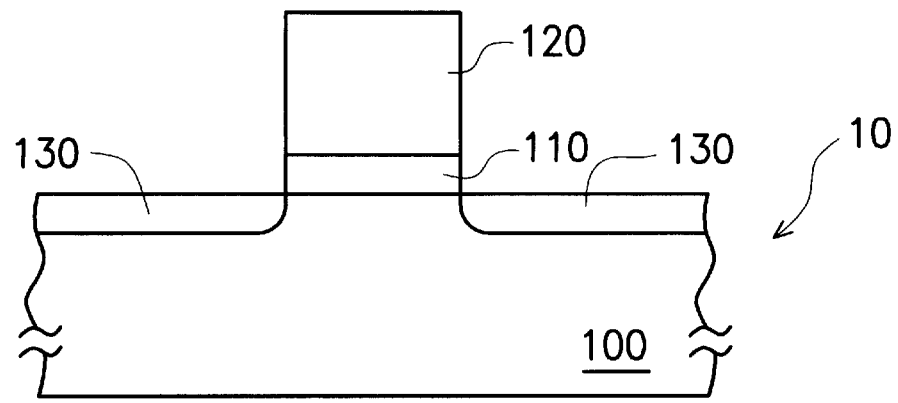
FIG. 1 is a schematic cross-sectional view of a metal-oxide-semiconductor with an ultra-shallow source/drain junction fabricated according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a metal-oxide-semiconductor with an ultra-shallow source/drain junction fabricated according to one preferred embodiment of this invention. As shown in FIG. 1, a gate oxide layer 110 and a gate 120 are sequentially formed over the semiconductor substrate 100 of the wafer 10 before forming the ultra-shallow source/drain junctions 130.

Figure 2A:
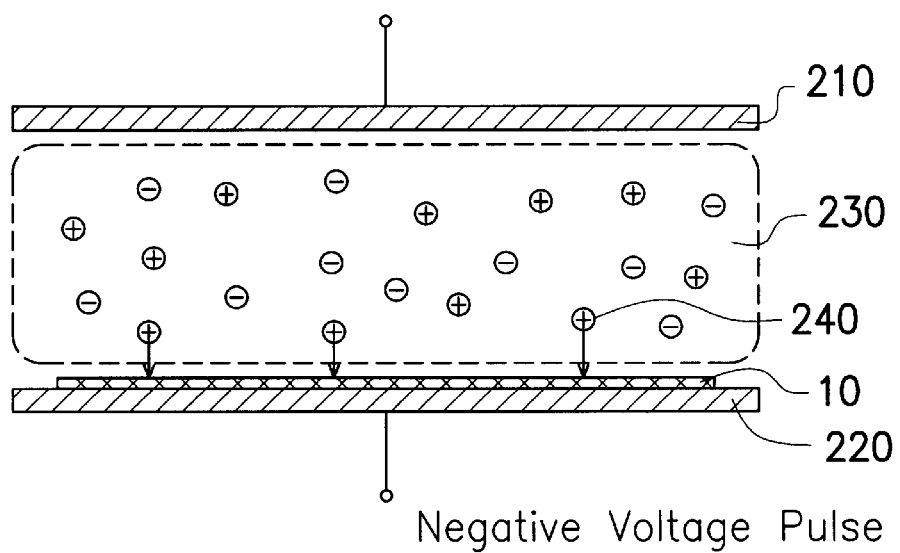
FIG. 2A is a schematic cross-sectional view of a device for forming an ultra-shallow source/drain junction using a boron difluoride plasma doping method according to this invention.

FIG. 2A is a schematic cross-sectional view of a device for forming ultra-shallow source/drain junctions using a boron difluoride plasma doping method according to. this invention. To form the ultra-shallow source/drain junctions 130, the wafer 10 is placed inside a reaction chamber (not shown) on an electrode plate 220. The electrode plate 220 is parallel to another electrode plate 210. A carrier gas and boron trifluoride ($BF_3$) are passed into the reaction chamber. The carrier gas can be argon, for example. A radio frequency power pulse train is then applied to the reaction chamber for generating a plasma 230 that contains boron difluoride ($BF_2^+$) ions 240. In the meantime, a negative voltage pulse train is applied to the wafer 10 via the electrode plate 220 so that the boron difluoride ($BF_2^+$) ions can intermittently but regularly bombard against the semiconductor substrate 100.

Ultimately, ultra-shallow source/drain junctions 130 are formed on a superficial layer of the semiconductor substrate 100 (as shown in FIG. 1). The plasma 230 generated by the aforementioned method is said to be generated by an induced coupling method. The boron difluoride ions ($BF_2^+$) 240 in the plasma 230 generated by induced coupling have an average energy level between 200 eV to 10 KeV (this value does not include the kinetic energy of the ions bombarding on the semiconductor substrate 100). The implant dosage of boron difluoride ions ($BF_2^+$) 240 is between $10^{15}/cm^2$ to $10^{17}/cm^2$ and implanted depth is smaller than 100 Å.

Figure 2B:
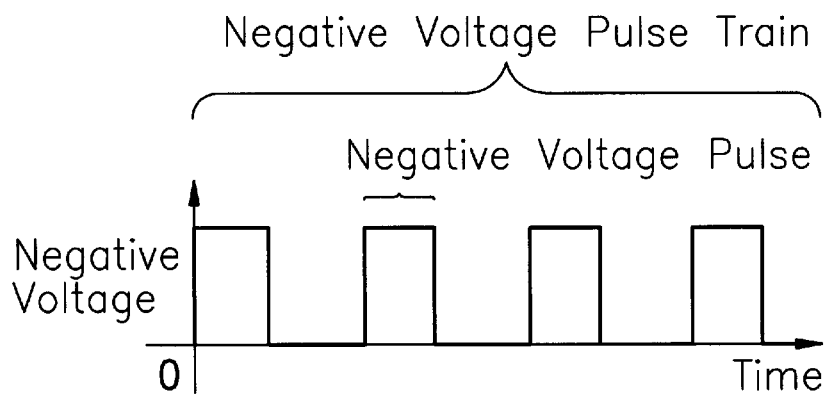
FIG. 2B is a graph showing the waveform of a negative voltage pulse train applied to the substrate terminal of the device shown in FIG. 2A.

In this invention, the device for forming the ultra-shallow source/drain junctions includes a radio frequency power source and a negative voltage pulse train. This is because concentration of the boron difluoride ions ($BF_2^+$) 240 within the plasma 230, concentration of electrons ($e^-$) and implantation energy level of the boron difluoride ions ($BF_2^+$) 240 can be better controlled. Both the radio frequency power pulse train and the negative voltage pulse train preferably have identical cycle frequency and pulse width. Identical cycle frequency and pulse width permit the boron difluoride ions, dissociated from boron trifluoride ($BF_3$) by the radio frequency power pulse, to accelerate in the presence of the negative voltage pulse train and bombard against the semiconductor substrate 100. FIG. 2B is a graph showing the waveform of a negative voltage pulse train applied to the substrate terminal of the device shown in FIG. 2A. As shown in FIG. 2B, the negative voltage pulse train has a cycle of about 100 ms and strength between −60V to −10 kV. In the negative voltage pulse train, the product of pulse length and strength is a major factor that controls the speed of bombardment of the boron difluoride ions ($BF_2^+$) 240 on the semiconductor substrate 100. In other words, the product is a major parameter that influences the ultimate depth of implantation of the boron difluoride ions ($BF_2^+$) 240.

A rapid thermal annealing operation is carried out to repair any defective lattice structure in the semiconductor substrate 100 caused by the formation of the ultra-shallow source/drain junction 130. The rapid annealing can be a spike annealing that includes raising the substrate to a highest temperature rapidly followed by an almost instantaneous cooling. The peak temperature of the rapid annealing is between about 1000° C. to 1200° C. The heating rate of the semiconductor substrate 100 is about 300° C./sec while the cooling rate is about 900° C./sec.

In this invention, the wafer is placed inside a reaction chamber and then boron difluoride plasma is generated inside the reaction chamber so that the entire wafer is surrounded by boron difluoride ions ($BF_2^+$). A suitable size negative voltage is applied to the semiconductor substrate to permit the implantation of boron difluoride ions ($BF_2^+$) into the substrate, thereby forming an ultra-shallow junction. Hence, this invention can be considered as a high-ion-flow rate global ion implantation. Unlike a conventional low-ion-flow-rate low-energy-level ion beam implantation, less time is required to produce each wafer and productivity can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A boron difluoride plasma doping method for forming an ultra-shallow junction in a semiconductor substrate, comprising the steps of:

surrounding a semiconductor substrate with a boron difluoride ($BF_2^+$) ion containing plasma inside a reaction chamber, wherein the boron-difluoride plasma is generated by radio frequency power, applying a negative voltage to the semiconductor substrate so that the boron difluoride ($BF_2^+$) ions within the plasma can bombard with the semiconductor substrate to form an ultra-shallow junction in the substrate; and performing a rapid annealing operation to repair any crystal lattice defects in the semiconductor substrate due to the formation of the ultra-shallow junction.

2. The method of claim 1, wherein the ultra-shallow junction includes an ultra-shallow source/drain junction.

3. The method of claim 1, wherein the radio frequency power is applied in the form of a pulse train and the negative voltage is also applied in the form of a pulse train such that both the radio frequency and the negative voltage have identical cycle time and that they initiate and end at the same time.

4. The method of claim 3, wherein both the radio frequency pulse train and the negative voltage pulse train have a cycle time of about 100 ms.

5. The method of claim 3, wherein the negative voltage pulse has a strength between about −60V to −10 kV.

6. The method of claim 1, wherein the boron difluoride ions ($BF_2^+$) within the plasma have an average energy level of between about 200 eV to 10 keV.

7. The method of claim 1, wherein the boron difluoride ions ($BF_2^+$) for forming the ultra-shallow junction have an implant dosage between about $10^{15}/cm^2$ to $10^{17}/cm^2$.

8. The method of claim 1, wherein implant depth of the boron difluoride ions ($BF_2^+$) for forming the ultra-shallow junction is smaller than 100 Å.

9. The method of claim 1, wherein the rapid thermal annealing operation is an instantaneous annealing operation, temperature control characteristics of the instantaneous annealing includes:

heating to a peak temperature rapidly; and cooling rapidly after reaching the peak temperature.

10. The method of claim 9, wherein the peak temperature is between about 1000° C. to 1200° C.

11. The method of claim 9, wherein the rate of heating of the semiconductor substrate is about 300° C./sec.

12. The method of claim 9, wherein the rate of cooling of the semiconductor substrate after reaching the peak temperature is about 900° C./sec.

13. The method of claim 1, wherein the boron difluoride ion ($BF_2^+$) containing plasma is in an induced coupling plasma state.

14. The method of claim 1, wherein the boron difluoride ion ($BF_2^+$) containing plasma further includes boron trifluoride and a carrier gas.

15. The method of claim 14, wherein the carrier gas includes argon.

* * * * *